(12) United States Patent
Yin et al.

(10) Patent No.: US 11,961,930 B2
(45) Date of Patent: Apr. 16, 2024

(54) CRYSTALLINE SILICON SOLAR CELL AND PREPARATION METHOD THEREFOR, AND PHOTOVOLTAIC ASSEMBLY

(71) Applicant: JINGAO SOLAR CO., LTD., Hebei (CN)

(72) Inventors: Haipeng Yin, Jiangsu (CN); Wei Shan, Jiangsu (CN); Kun Tang, Jiangsu (CN)

(73) Assignee: JINGAO SOLAR CO., LTD., Xingtai (CN)

( * ) Notice: Subject to any disclaimer, the term of this patent is extended or adjusted under 35 U.S.C. 154(b) by 88 days.

(21) Appl. No.: 17/296,492

(22) PCT Filed: Jun. 28, 2019

(86) PCT No.: PCT/CN2019/093529
§ 371 (c)(1),
(2) Date: May 24, 2021

(87) PCT Pub. No.: WO2020/107887
PCT Pub. Date: Jun. 4, 2020

(65) Prior Publication Data
US 2022/0029040 A1  Jan. 27, 2022

(30) Foreign Application Priority Data
Nov. 27, 2018 (CN) .......................... 201821965911.8

(51) Int. Cl.
*H01L 31/068* (2012.01)
*H01L 31/0224* (2006.01)
*H01L 31/036* (2006.01)

(52) U.S. Cl.
CPC .... *H01L 31/068* (2013.01); *H01L 31/022425* (2013.01); *H01L 31/036* (2013.01)

(58) Field of Classification Search
CPC ........... H01L 31/068; H01L 31/022425; H01L 31/036; H01L 31/1868
See application file for complete search history.

(56) References Cited

U.S. PATENT DOCUMENTS

2010/0055822 A1*  3/2010  Weidman .............. G01T 1/2018
                                                              438/57
2010/0319763 A1* 12/2010  Park ....................... H01L 31/18
                                                              257/E31.032
(Continued)

FOREIGN PATENT DOCUMENTS

CN     101931029 A    12/2010
CN     102623517 A     8/2012
(Continued)

OTHER PUBLICATIONS

CN 101931029A English machine translation. (Year: 2010).*
(Continued)

*Primary Examiner* — Golam Mowla
(74) *Attorney, Agent, or Firm* — Volpe Koenig

(57) ABSTRACT

The present disclosure relates to the technical field of solar cells, and relates to a crystalline silicon solar cell and a preparation method thereof, and a photovoltaic assembly. The crystalline silicon solar cell includes a crystalline silicon substrate, a passivation layer that is disposed on the crystalline silicon substrate and that is provided with through holes, a carrier collection layer that is disposed on the passivation layer, and electrodes that contact the carrier collection layer; the carrier collection layer contacts the crystalline silicon substrate by means of the through holes on the passivation layer. In the described crystalline silicon solar cell, through holes are provided on the passivation layer, and the carrier collection layer contacts the crystalline silicon substrate by means of the through holes on the passivation layer.

12 Claims, 8 Drawing Sheets

(56) References Cited

U.S. PATENT DOCUMENTS

| | | | | |
|---|---|---|---|---|
| 2011/0272011 | A1* | 11/2011 | Lochtefeld | H01L 31/1804 |
| | | | | 136/255 |
| 2012/0138138 | A1* | 6/2012 | Granek | H01L 31/1804 |
| | | | | 257/E31.124 |
| 2013/0316520 | A1 | 11/2013 | Hekmatshoar-Tabari et al. | |
| 2014/0158192 | A1* | 6/2014 | Cudzinovic | H01L 31/022441 |
| | | | | 136/256 |
| 2014/0299187 | A1* | 10/2014 | Chang | H01L 31/186 |
| | | | | 136/258 |
| 2015/0381109 | A1* | 12/2015 | Choi | H01L 31/0201 |
| | | | | 136/251 |

FOREIGN PATENT DOCUMENTS

| | | |
|---|---|---|
| CN | 104201214 A | 12/2014 |
| CN | 104201215 A | 12/2014 |
| CN | 106252425 A | 12/2016 |
| CN | 106784167 A | 5/2017 |
| CN | 108305910 A | 7/2018 |
| CN | 113330583 B | 7/2023 |
| JP | 10041531 A | 2/1998 |
| JP | 2013125890 A | 6/2013 |
| JP | 2013524514 A | 6/2013 |
| JP | 2013197587 A | 9/2013 |
| JP | 2018093168 A | 6/2018 |

OTHER PUBLICATIONS

International Search Report dated Sep. 11, 2019 (4 pgs.).

Brendel, R. et al, "Screening Carrier Selective Contact Combinations for Novel Crystalline Si Cell Structures", 35th European Photovoltaic Solar Energy Conference and Exhibition, Proceedings of the International Conference, WIP, Sylvensteinstr. 2 81369 Munich, Germany, Sep. 24, 2018 (Sep. 24, 2018) (pp. 39-46) XP040705743, ISBN: 978-3-936338-50-8.

* cited by examiner

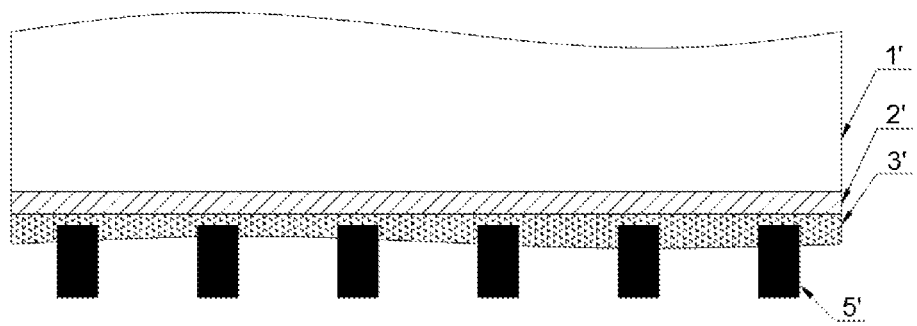
Fig. 1
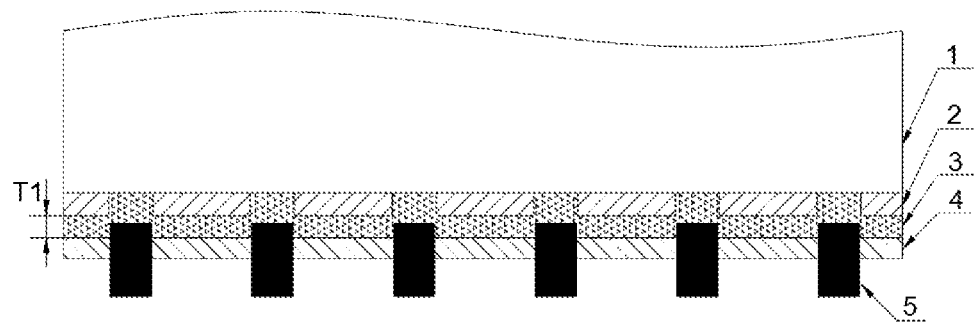
Fig. 2
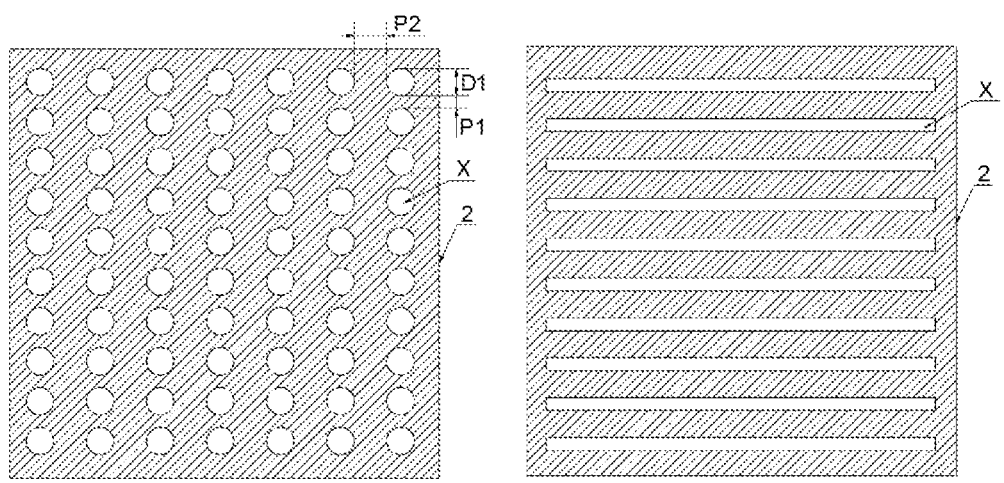
Fig. 3a
Fig. 3b

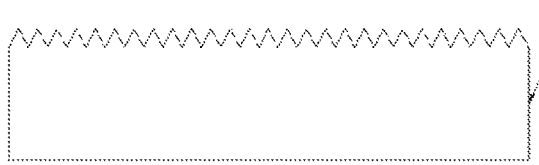
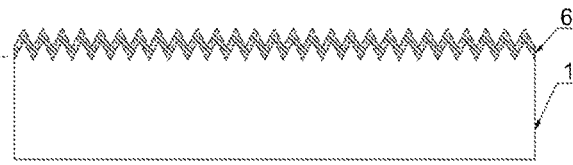
Fig. 9a
Fig. 9b
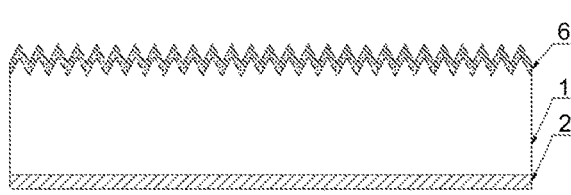
Fig. 9c
Fig. 9d
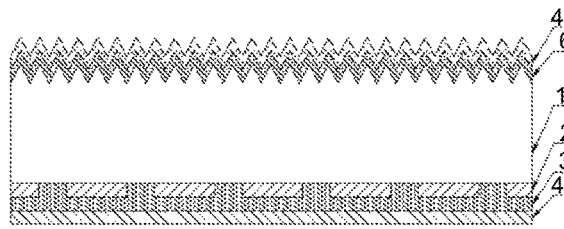
Fig. 9e
Fig. 9f
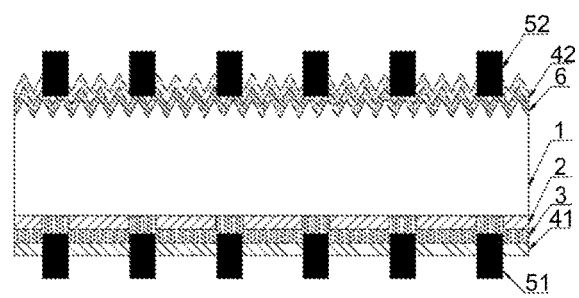
Fig. 9g

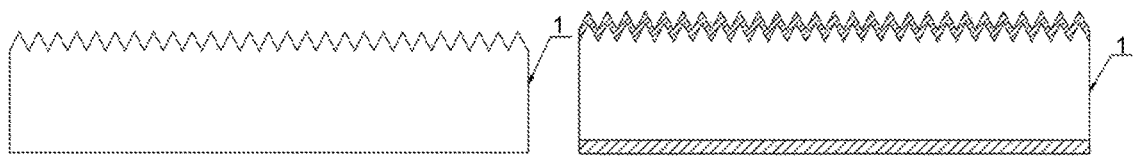
Fig. 11a Fig. 11b
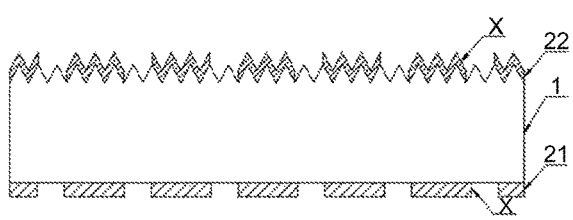
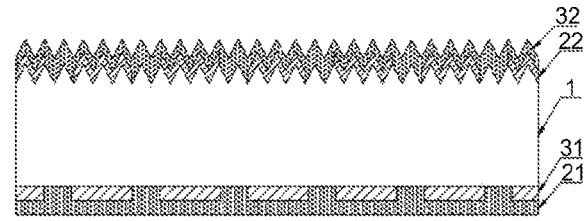
Fig. 11c Fig. 11d
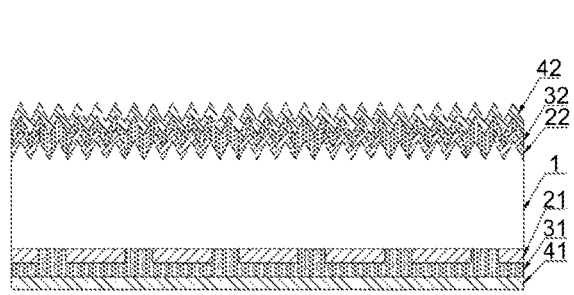
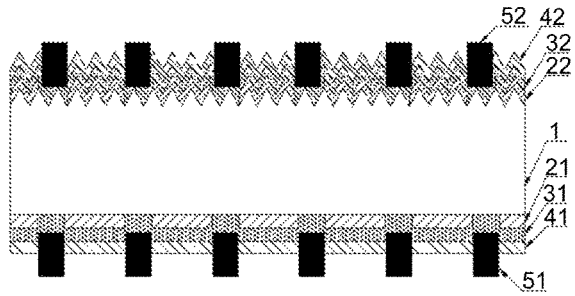
Fig. 11e Fig. 11f

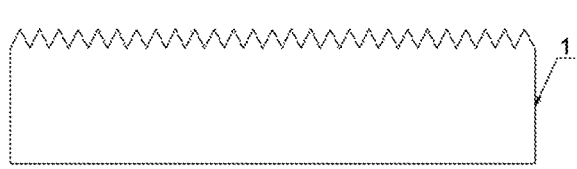
Fig. 12a
Fig. 12b
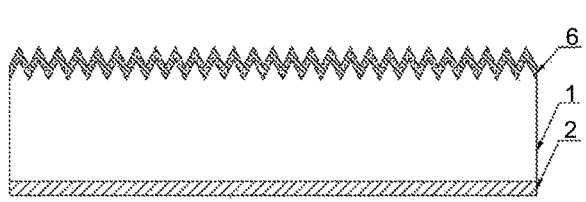
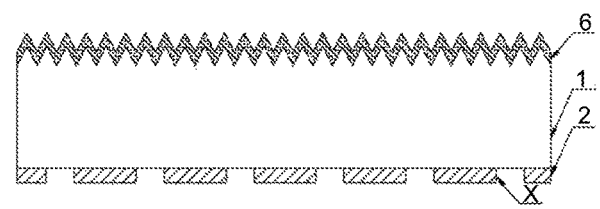
Fig. 12c
Fig. 12d
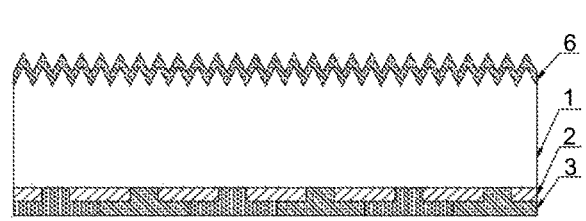
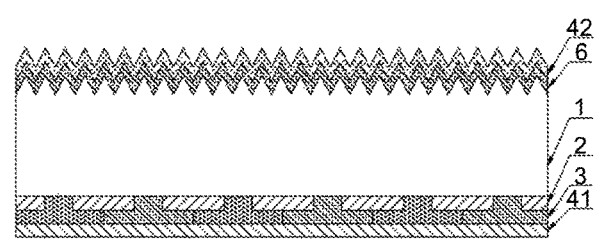
Fig. 12e
Fig. 12f
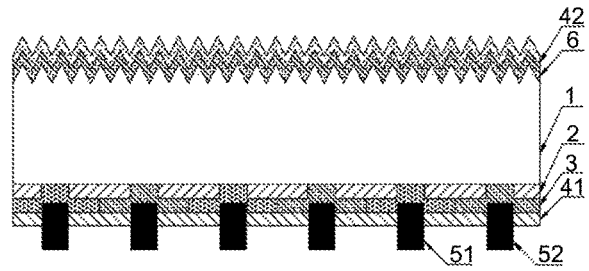
Fig. 12g

CRYSTALLINE SILICON SOLAR CELL AND PREPARATION METHOD THEREFOR, AND PHOTOVOLTAIC ASSEMBLY

CROSS REFERENCE TO RELATED APPLICATION

This disclosure claims the priority of the Chinese patent application filed with the State Intellectual Property Office of China on Nov. 27, 2018 with the application No. 201821965911.8 and the invention titled "crystalline silicon solar cell and photovoltaic module", the entire contents of which are incorporated by reference in this disclosure.

TECHNICAL FIELD

The present disclosure relates to the technical field of solar cells, in particular to a crystalline silicon solar cell, preparation method thereof, and photovoltaic module.

BACKGROUND

Photovoltaic power generation is a power generation method of converting solar energy into electrical energy by using large-area P-N junction diodes. It is a clean, sustainable, and relatively cost-effective power generation method. The aforementioned P-N junction diode is called as solar cell. The crystalline silicon solar cell is a solar cell widely used. The photoelectric conversion performance of crystalline silicon solar cell depends on the concentration of its internal minority carrier. The recombination and annihilation of minority carriers will cause the loss of voltage and current of crystalline silicon solar cells, thereby reducing the photoelectric conversion efficiency of crystalline silicon solar cells. For crystalline silicon solar cells, defect on the surface of the crystalline silicon substrate is a serious recombination center. It is usually necessary to provide a passivation structure between the surface of the crystalline silicon substrate and the electrode to passivate the surface of the crystalline silicon substrate, so as to reduce the recombination rate of minority carriers on the surface of the crystalline silicon substrate, and to improve the photoelectric conversion efficiency of the crystalline silicon solar cell.

A crystalline silicon solar cell having a tunnel oxidation passivation contact structure is provided in the related art (as shown in FIG. 1), which includes a crystalline silicon substrate 1', a passivation tunneling layer 2' disposed on the crystalline silicon substrate 1', a carrier collection layer 3' disposed on the passivation tunneling layer 2', and an electrode 5' that comes into ohmic contact with the carrier collection layer 3'. The crystalline silicon solar cell of such structure can effectively solve the passivation problem between the surface of the crystalline silicon substrate 1' and the electrode 5'.

However, the passivation tunneling layer cannot achieve effective carrier transmission, which results in a high series resistance of the crystalline silicon solar cell and affects the photoelectric conversion efficiency of the crystalline silicon solar cell.

SUMMARY

The embodiments of the present disclosure provide a crystalline silicon solar cell, a preparation method thereof, and a photovoltaic module, which can solve the above problems of high series resistance of the crystalline silicon solar cell and unsatisfactory photoelectric conversion efficiency.

Specifically, it comprises the following technical solutions.

In the first aspect, the embodiment of the present disclosure provides a crystalline silicon solar cell, comprising:
  a crystalline silicon substrate,
    a passivation layer that is provided on the crystalline silicon substrate and having through holes,
    a carrier collection layer that is provided on the passivation layer, and,
    an electrode that is in contact with the carrier collection layer;
    wherein, the carrier collection layer comes into contact with the crystalline silicon substrate via the through hole in the passivation layer.

Optionally, in a direction parallel to the surface of the crystalline silicon substrate, the through hole has a cross-section of linear, circular, or polygonal shape.

Optionally, a plurality of through holes are provided on the passivation layer.

Optionally, the electrode has the portion corresponding to the through hole on the passivation layer.

Optionally, the passivation layer is an oxide layer.

Optionally, the thickness of the passivation layer is 0.3 nm to 100 nm.

Optionally, the carrier collection layer is a doped silicon layer.

Optionally, the carrier collection layer is a doped polysilicon layer or a doped amorphous silicon layer.

Optionally, the thickness of the carrier collection layer is 30 nm to 500 nm.

Optionally, the crystalline silicon solar cell further includes: an anti-reflection layer disposed on the carrier collection layer; the electrode passes through the anti-reflection layer and contacts the carrier collection layer.

In the second aspect, an embodiment of the present disclosure provides another crystalline silicon solar cell, comprising:
  a crystalline silicon substrate,
  a passivation layer provided on one side of the crystalline silicon substrate and having through holes,
  a carrier collection layer that is provided on the passivation layer,
  a first electrode that is in contact with the carrier collection layer,
  a doped layer that is provided on the other side of the crystalline silicon substrate, and,
  a second electrode that is in contact with the doped layer;
  wherein, the carrier collection layer comes into contact with the crystalline silicon substrate via the through hole in the passivation layer;
  the carrier collection layer has a conductivity type that is opposite to that of the doped layer.

Optionally, in a direction parallel to the surface of the crystalline silicon substrate, the through hole has a cross-section of linear, circular, or polygonal shape.

Optionally, a plurality of through holes are provided on the passivation layer.

Optionally, the electrode has the portion corresponding to the through hole on the passivation layer.

Optionally, the passivation layer is an oxide layer.

Optionally, the thickness of the passivation layer is 0.3 nm to 100 nm.

Optionally, the carrier collection layer is a doped silicon layer.

Optionally, the carrier collection layer is a doped polysilicon layer or a doped amorphous silicon layer.

Optionally, the thickness of the carrier collection layer is 30 nm to 500 nm.

Optionally, the crystalline silicon solar cell further includes: the first anti-reflection layer disposed on the carrier collection layer, and/or the second anti-reflection layer disposed on the doped layer; the first electrode contacts the carrier collection layer through the first anti-reflection layer, and the second electrode contacts the doped layer through the second anti-reflection layer.

In the third aspect, the embodiments of the present disclosure further provide another crystalline silicon solar cell, comprising:
- a crystalline silicon substrate,
- a first passivation layer that is provided on one side of the crystalline silicon substrate and has through holes,
- a first carrier collection layer that is provided on the first passivation layer,
- a first electrode that is in contact with the first carrier collection layer,
- the second passivation layer that is provided on the other side of the crystalline silicon substrate and has through holes,
- a second carrier collection layer that is provided on the second passivation layer, and,
- a second electrode that is in contact with the second carrier collection layer;
- wherein, the first carrier collection layer comes into contact with the crystalline silicon substrate via the through hole on the first passivation layer; the second carrier collection layer comes into contact with the crystalline silicon substrate via the through hole on the second passivation layer;

The first carrier collection layer has a conductivity type that is opposite to that of second carrier collection layer.

Optionally, in a direction parallel to the surface of the crystalline silicon substrate, the through hole has a cross-section of linear, circular, or polygonal shape.

Optionally, both the first passivation layer and the second passivation layer are provided with a plurality of through holes.

Optionally, the first electrode has a part corresponding to the through hole on the first passivation layer; the second electrode has a part corresponding to the through hole on the second passivation layer.

Optionally, the first passivation layer is an oxide layer, and the second passivation layer is an oxide layer.

Optionally, the thickness of the first passivation layer is 0.3 nm to 100 nm, and the thickness of the second passivation layer is 0.3 nm to 100 nm.

Optionally, the first carrier collection layer is a doped silicon layer, and the second carrier collection layer is a doped silicon layer.

Optionally, the first carrier collection layer is a doped polysilicon layer or a doped amorphous silicon layer, and the second carrier collection layer is a doped polysilicon layer or a doped amorphous silicon layer.

Optionally, the thickness of the first carrier collection layer is 30 nm to 500 nm, and the thickness of the second carrier collection layer is 30 nm to 500 nm.

Optionally, the crystalline silicon solar cell further includes: the first anti-reflection layer disposed on the first carrier collection layer, and/or the second anti-reflection layer disposed on the second carrier collection layer; the first electrode passes through the first anti-reflection layer and contacts the first carrier collection layer, and the second electrode passes through the second anti-reflection layer and contacts the second carrier collection layer.

In the fourth aspect, the embodiments of the present disclosure provide yet another crystalline silicon solar cell, comprising:
- a crystalline silicon substrate,
- a passivation layer that is provided on one side of the crystalline silicon substrate and has through holes,
- a carrier collection layer that is provided on the passivation layer and has a first region and a second region having opposite conductivity types,
- a first electrode that is in contact with the first region of the carrier collection layer,
- a second electrode that is in contact with the second region of the carrier collection layer, and,
- a doped layer that is provided on the other side of the crystalline silicon substrate;
- wherein, the carrier collection layer comes into contact with the crystalline silicon substrate via the through hole on the passivation layer.

The conductivity type of the doped layer is the same as that of the crystalline silicon substrate.

Optionally, the carrier collection layer has a plurality of the first regions and a plurality of the second regions, and the plurality of the first regions and the plurality of the second regions are distributed alternately.

Optionally, in a direction parallel to the surface of the crystalline silicon substrate, the through hole has a cross-section of linear, circular, or polygonal shape.

Optionally, a plurality of through holes are provided on the passivation layer.

Optionally, the first electrode has a part corresponding to the through hole on the passivation layer, and the second electrode has a part corresponding to the through hole on the passivation layer, Optionally, the passivation layer is an oxide layer.

Optionally, the thickness of the passivation layer is 0.3 nm to 100 nm.

Optionally, the carrier collection layer is a doped silicon layer.

Optionally, the carrier collection layer is a doped polysilicon layer or a doped amorphous silicon layer.

Optionally, the thickness of the carrier collection layer is 30 nm to 500 nm.

Optionally, the crystalline silicon solar cell further includes: the first anti-reflection layer provided on the carrier collection layer, and/or the second anti-reflection layer provided on the doped layer; The first electrode passes through the first anti-reflection layer and contacts the first region of the carrier collection layer, and the second electrode passes through the second anti-reflection layer and contacts the second region of the carrier collection layer.

In the fifth aspect, the embodiments of the present disclosure provide a method for preparing a crystalline silicon solar cell, comprising:
- providing a crystalline silicon substrate;
- a passivation layer that is provided on the crystalline silicon substrate and has through holes;
- forming a carrier collection layer on the passivation layer and on the portion of the crystalline silicon substrate corresponding to the through hole of the passivation layer;
- forming an electrode that is in contact with the carrier collection layer.

Optionally, the preparation method further includes: forming an anti-reflection layer on the carrier collection layer.

Optionally, a passivation layer having through holes formed on the crystalline silicon substrate, comprising:
a passivation layer that is formed on the crystalline silicon substrate; opening a through hole on the passivation layer.

Optionally, a carrier collection layer formed on the passivation layer and on the portion of the crystalline silicon substrate corresponding to the through holes of the passivation layer, comprising:
in an environment where a doping source exists, a doped silicon layer formed on the passivation layer and on the portion of the crystalline silicon substrate opposite to the through holes of the passivation layer;
or,
providing an intrinsic silicon layer on the passivation layer and the portion of the crystalline silicon substrate corresponding to the through hole of the passivation layer;
forming a doped silicon layer by doping the intrinsic silicon layer.

In the sixth aspect, the embodiments of the present disclosure provide another method for preparing a crystalline silicon solar cell, comprising:
providing a crystalline silicon substrate,
forming a passivation layer on one side of the crystalline silicon substrate and has through holes,
forming a carrier collection layer on the passivation layer and on a portion of the crystalline silicon substrate corresponding to the through hole of the passivation layer;
forming a doped layer has a conductivity type that is opposite to that of the carrier collection layer on the other side of the crystalline silicon substrate,
forming a first electrode that is in contact with the carrier collection layer,
forming a second electrode that is in contact with the doped layer.

Optionally, the preparation method further includes:
forming a first anti-reflection layer on the carrier collection layer;
forming a second anti-reflection layer on the doped layer.

Optionally, a passivation layer provided on the crystalline silicon substrate and having through holes includes:
forming a passivation layer on the crystalline silicon substrate;
opening a through hole on the passivation layer.

Optionally, a carrier collection layer formed on the passivation layer and on a portion of the crystalline silicon substrate opposite to the through holes of the passivation layer, comprising:
in an environment where a doping source exists, forming a doped silicon layer on the passivation layer and a portion of the crystalline silicon substrate corresponding to the through hole of the passivation layer;
or,
forming an intrinsic silicon layer on the passivation layer and the portion of the crystalline silicon substrate opposite to the through hole of the passivation layer;
forming a doped silicon layer by doping the intrinsic silicon layer.

In a seventh aspect, the embodiments of the present disclosure provide yet another method for preparing a crystalline silicon solar cell, comprising:
providing a crystalline silicon substrate;
forming a first passivation layer on one side of the crystalline silicon substrate and has through holes;
forming a second passivation layer on the other side of the crystalline silicon substrate and has through holes;
forming a first carrier collection layer on the first passivation layer and on a portion of the crystalline silicon substrate corresponding to the through hole of the first passivation layer;
forming a second carrier collection layer has a conductivity type that is opposite to that of the first carrier on the second passivation layer and on the portion of the crystalline silicon substrate corresponding to the through hole of the second passivation layer
forming a first electrode that is in contact with the first carrier collection layer,
forming a second electrode that is in contact with the second carrier collection layer.

Optionally, the preparation method further includes:
forming a first anti-reflection layer on the first carrier collection layer;
forming a second anti-reflection layer on the second carrier collection layer.

Optionally, the first passivation layer that is formed on the crystalline silicon substrate and has through holes includes:
forming a first passivation layer on the crystalline silicon substrate;
opening a through hole on the first passivation layer;
forming a second passivation layer on the crystalline silicon substrate and has through holes, comprising:
forming a second passivation layer on the crystalline silicon substrate;
opening a through hole on the second passivation layer.

Optionally, the first carrier collection layer formed on the first passivation layer and on portion of the crystalline silicon substrate corresponding to the through holes of the first passivation layer, comprising:
in an environment where a doping source exists, forming a first doped silicon layer on the first passivation layer and on portion of the crystalline silicon substrate corresponding to the through hole of the first passivation layer;
or,
forming a first intrinsic silicon layer on the first passivation layer and on portion of the crystalline silicon substrate corresponding to the through hole of the first passivation layer;
forming a first doped silicon layer by doping the first intrinsic silicon layer.

Forming a second carrier collection layer on the second passivation layer and on portion of the crystalline silicon substrate corresponding to the through holes of the second passivation layer, comprising:
in an environment where a doping source exists, forming a second doped silicon layer on the second passivation layer and on portion of the crystalline silicon substrate corresponding to the through hole of the second passivation layer;
or,
forming a second intrinsic silicon layer on the second passivation layer and on portion of the crystalline silicon substrate corresponding to the through hole of the second passivation layer;
forming a second doped silicon layer by doping the second intrinsic silicon layer.

In the eighth aspect, the embodiments of the present disclosure provide yet another method for preparing a crystalline silicon solar cell, comprising:
providing a crystalline silicon substrate;

a passivation layer that is formed on one side of the crystalline silicon substrate and has through holes;

forming a carrier collection layer that has a first region and a second region having opposite conductivity types on the passivation layer and on portion of the crystalline silicon substrate corresponding to the through hole of the passivation layer;

forming a doped layer having a conductivity type same as that of the crystalline silicon substrate on the other side of the crystalline silicon substrate;

forming a first electrode in contact with the first region of the carrier collection layer;

forming a second electrode in contact with the second region of the carrier collection layer.

Optionally, the preparation method further includes:

forming a first anti-reflection layer on the carrier collection layer;

forming a second anti-reflection layer on the doped layer.

Optionally, a passivation layer with through holes formed on the crystalline silicon substrate includes:

forming a passivation layer on the crystalline silicon substrate; opening a through hole on the passivation layer.

Optionally, forming a carrier collection layer that has a first region and a second region having opposite conductivity types on the passivation layer and on portion of the crystalline silicon substrate corresponding to the through hole of the passivation layer, comprising:

forming an intrinsic silicon layer on the passivation layer and the portion of the crystalline silicon substrate corresponding to the through hole of the passivation layer;

forming a doped silicon layer that has a first region and a second region having opposite conductivity types by doping the first region and the second region of the intrinsic silicon layer with a first doping source and a second doping source having opposite conductivity types.

In the ninth aspect, the embodiments of the present disclosure provide a photovoltaic module, comprising: a cover plate, the first encapsulating adhesive film, a solar cell string, the second encapsulating adhesive film, and a back sheet arranged in sequence, the solar cell string comprising a plurality of solar cells. The solar cell is the aforementioned crystalline silicon solar cell.

The beneficial effects of the technical solutions provided by the embodiments of the present disclosure include at least:

In the crystalline silicon solar cell provided by the embodiment of the present disclosure, a through hole is opened on the passivation layer, and the carrier collection layer comes into contact with the crystalline silicon substrate via the through hole on the passivation layer. On the basis of ensuring a good surface passivation effect, the carriers can pass through the interface between the crystalline silicon substrate and the carrier collection layer to be collected by the electrode, to achieve more effective carrier transmission, to reduce the series resistance of crystalline silicon solar cells, and to increase the fill factor of crystalline silicon solar cells, thereby improving the photoelectric conversion efficiency of crystalline silicon solar cells.

BRIEF DESCRIPTION OF THE DRAWINGS

In order to more clearly describe the technical solutions in the embodiments of the present disclosure, the following is a brief description of the drawings required to be used in the description of the embodiment.

FIG. 1 is a schematic structural diagram of a crystalline silicon solar cell provided by related technologies;

FIG. 2 is a schematic structural diagram of a crystalline silicon solar cell provided by an embodiment of the disclosure;

FIG. 3a is a schematic structural diagram of a through hole in a passivation layer in a crystalline silicon solar cell provided by an embodiment of the disclosure;

FIG. 3b is a schematic structural diagram of another through hole in a passivation layer in a crystalline silicon solar cell provided by an embodiment of the disclosure;

FIG. 9a to FIG. 9g are schematic diagrams of the preparation method of the crystalline silicon solar cell shown in FIG. 5;

FIG. 11a to FIG. 11f are schematic diagrams of the preparation method of the crystalline silicon solar cell shown in FIG. 7;

FIG. 12a to FIG. 12g are schematic diagrams of the preparation method of the crystalline silicon solar cell shown in FIG. 8.

Figure 4A:
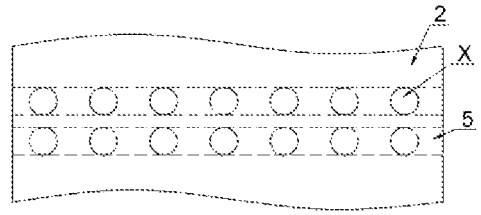
FIG. 4a is a schematic diagram of one type of positional relationship between through holes and electrodes in a crystalline silicon solar cell provided by an embodiment of the disclosure.

The reference signs in the FIG. respectively indicate:
1 crystalline silicon substrate
2 passivation layer
21 first passivation layer
22 second passivation layer
3 carrier collection layer
31 first carrier collection layer
32 second carrier collection layer
301 first region
302 second region 4 anti-reflection layer
41 first anti-reflection layer
42 second anti-reflection layer
5 electrode
51 first electrode
52 second electrode
6 doped layer
X through hole
T1 the thickness of the carrier collection layer
D1 the diameter of a through hole with circular cross-sectional shape
P1 the distance between two adjacent through holes with circular cross-sectional shapes in the same column
P2 the distance between two adjacent through holes with circular cross-sectional shapes in the same row
1' crystalline silicon substrate of the crystalline silicon solar cell provided by the related technology
2' tunneling passivation layer of crystalline silicon solar cell provided by related technology
3' carrier collection layer of crystalline silicon solar cell provided by related technology
5' electrode of crystalline silicon solar cells provided by related technology

DETAILED DESCRIPTION

In order to make the technical solutions and advantages of the present disclosure clearer, the following further describes the embodiments of the present disclosure in detail with reference to the accompanying drawings.

Unless otherwise defined, all technical terms used in the embodiments of the present disclosure have the same meaning as commonly understood by the person skilled in the art.

Improving the photoelectric conversion efficiency of crystalline silicon solar cells is an effective way to increase the output power of photovoltaic power generation and reduce the cost of per Kilowatt Hour. Currently, one of the important factors limiting the photoelectric conversion efficiency of monolithic crystalline silicon solar cells is the recombination annihilation of minority carriers in crystalline silicon solar cells. The recombination annihilation of minority carriers will cause the loss of voltage and current of crystalline silicon solar cells, thereby reducing the photoelectric conversion efficiency of crystalline silicon solar cells. Providing a passivation structure on the surface of the crystalline silicon substrate can reduce the recombination rate of minority carriers on the surface of the crystalline silicon substrate, which is beneficial to improve the photoelectric conversion efficiency of the crystalline silicon solar cell.

In the traditional tunnel oxidation passivation contact crystalline silicon solar cell, carriers pass through the passivation tunneling layer into the carrier collection layer, and then are collected by the electrode. However, the passivation tunneling layer cannot well realize the effective transmission of carriers, resulting in high series resistance of the crystalline silicon solar cell, thereby affecting the photoelectric conversion efficiency of the crystalline silicon solar cell.

Based on the foregoing, the embodiments of the present disclosure optimize and improve the structure of the crystalline silicon solar cell, while ensuring the passivation effect, improving the carrier transmission capacity, thereby improving the photoelectric conversion efficiency of the crystalline silicon solar cell.

FIG. 2 is a schematic structural diagram of a crystalline silicon solar cell provided by an embodiment of the present disclosure. As shown in FIG. 2, the crystalline silicon solar cell includes: a crystalline silicon substrate 1, and passivation layer 2 with through hole X provided on crystalline silicon substrate 1, the carrier collection layer 3 provided on the passivation layer 2, and the electrode 5 that is in contact with the carrier collection layer 3.

Wherein, the through hole X refers to a hole passing through the thickness direction of the passivation layer 2, and the carrier collection layer 3 contacts the crystalline silicon substrate 1 via the through hole X on the passivation layer 2.

In the solar cell provided by the embodiments of the present disclosure, the passivation layer 2 and the carrier collection layer 3 provided on the crystalline silicon substrate 1 play a passivation function together, ensuring that the crystalline silicon solar cell has a higher open circuit voltage and short circuit current. On this basis, the passivation layer 2 is provided with a through hole X, the carrier collection layer 3 contacts the crystalline silicon substrate 1 via the through hole X on the passivation layer 2, and the carriers can pass through the interface between the crystalline silicon substrate 1 and the carrier collection layer 3 to be collected by the electrode 5 to achieve more effective carrier transfer, reduce the series resistance of the crystalline silicon solar cell, and increase the fill factor of the crystalline silicon solar cell, thereby improving the photoelectric conversion efficiency of crystalline silicon solar cells.

The shape of the through hole X on the passivation layer 2 is not strictly limited. For example, in the direction parallel to the surface of the crystalline silicon substrate 1, the cross section of the through hole X (Hereinafter, unless otherwise specified, the section refers to the section in the direction parallel to the surface of the crystalline silicon substrate 1) may be linear, circular (as shown in FIG. 3a), elliptical or polygonal shape. Among them, the linear-shape hole can be a straight line (as shown in FIG. 3b), it can also be a curve, a broken line, etc.; a polygonal-shape hole can be a triangle, a quadrilateral, a pentagon, a hexagon, etc., and it can be an ordinary polygon or a regular polygon.

There may be multiple through holes X on the passivation layer 2, and multiple through holes X may be provided according to a certain rule. For example, it can be provided in a row×b column (a≥1, b≥1, where a and b are not 1 at the same time).

As shown in FIG. 3a, taking the through hole X with a circular cross-sectional shape as an example, the diameter of the through hole X (the size indicated by D1 in FIG. 3a) can be 0.01 mm to 1 mm, such as 0.01 mm, 0.02 mm, 0.03 mm, 0.04 mm, 0.05 mm, 0.06 mm, 0.07 mm, 0.08 mm, 0.09 mm, 0.1 mm, 0.2 mm, 0.3 mm, 0.4 mm, 0.5 mm, 0.6 mm, 0.7 mm, 0.8 mm, 0.9 mm, 1 mm, etc. The distance between two adjacent through holes X in the same column (the size indicated by P1 in FIG. 3a, the distance between the edges of the two through holes X) can be 0.3 mm to 3 mm, such as 0.3 mm, 0.4 mm, 0.5 mm, 0.6 mm, 0.7 mm, 0.8 mm, 0.9 mm, 1 mm, 1.1 mm, 1.2 mm, 1.3 mm, 1.4 mm, 1.5 mm, 1.6 mm, 1.7 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, etc.; the distance between two adjacent through holes X in the same row (the size indicated by P2 in FIG. 3a, the distance between the edges of the two through holes X) can be 0.3 mm to 3 mm, such as 0.3 mm, 0.4 mm, 0.5 mm, 0.6 mm, 0.7 mm, 0.8 mm, 0.9 mm, 1 mm, 1.1 mm, 1.2 mm, 1.3 mm, 1.4 mm, 1.5 mm, 1.6 mm, 1.7 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm etc.

All the through holes X may have the same shape, or some of the through holes X may have the same shape.

The cross-sectional region of each through hole X and the number of through holes X are not strictly limited, and can be set according to actual needs. In the embodiments of the present disclosure, the ratio of the total open region of all through holes X to the region of the passivation layer 2 may be: 0.1% to 5%, for example, 0.1%, 0.2%, 0.4%, 0.5%, 0.6%, 0.8%, 1.0%, 1.2%, 1.4%, 1.5%, 1.6%, 1.8%, 2.0%, 2.2%, 2.4%, 2.5%, 2.6%, 2.8%, 3.0%, 3.2%, 3.4%, 3.5%, 3.6%, 3.8%, 4%, 4.2%, 4.4%, 4.5%, 4.6%, 4.8%, 5.0%, etc.

In the embodiments of the present disclosure, the electrode 5 may have a portion corresponding to the through hole X on the passivation layer 2. The "corresponding" mentioned here means that on a plane parallel to the surface of the crystalline silicon substrate, the projection of the electrode 5 and the projection of the through hole X have overlapping portions.

The electrode 5 may include a plurality of sub-regions (for example, each gate line of the electrode 5 of the gate line structure). Each sub-region may have a portion corresponding to the through hole X (for example, each gate line has a portion corresponding to the through hole X); or a part of the sub-region may have a portion corresponding to the through hole X, and another part of the sub-region may not have any portions corresponding to the passage X (for example, a part of the gate line has a portion corresponding to the through hole X, and another part of the gate line does not have a region corresponding to the through hole X).

For a certain sub-region of the electrode having a portion corresponding to the through hole X, the relative positional relationship with the through hole X can have different implementations. In the following, an electrode with a gate line structure is taken as an example to illustrate possible implementations of the relative positional relationship between a single sub-region of the electrode 5 and the through hole X.

In a possible implementation, as shown in FIG. 4a, the through holes X are circular and provided in multiple rows, the width of the gate line is basically the same as the diameter of the through hole X, and the center line of the gate line and the center line of a row of through holes X basically coincide.

Figure 4B:
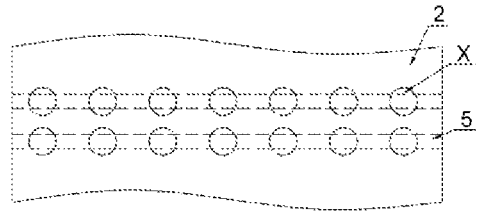
FIG. 4b is a schematic diagram of another type of positional relationship between through holes and electrodes in the crystalline silicon solar cell provided by the embodiment of the disclosure.

In another possible implementation, as shown in FIG. 4b, the through holes X are circular and provided in multiple rows, the width of the gate line is smaller than the diameter of the through hole X, and the center line of the gate line and the center line of a row of through holes X basically coincide.

Figure 4C:
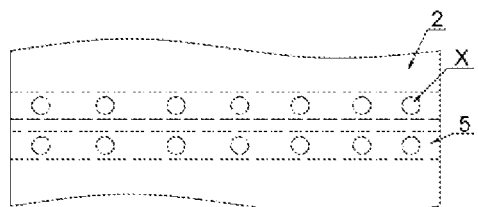
FIG. 4c is a schematic diagram of another type of positional relationship between through holes and electrodes in a crystalline silicon solar cell provided by an embodiment of the disclosure.

In another possible implementation, as shown in FIG. 4c, the through holes X are circular and provided in multiple rows, the width of the gate line is greater than the diameter of the through hole X, and the center line of the gate line and the center line of a row of through holes X basically coincide.

Figure 4D:
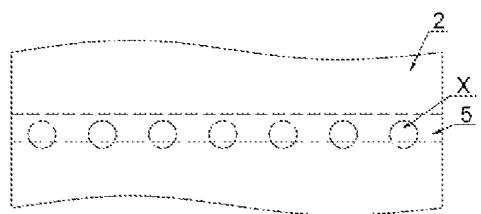
FIG. 4d is a schematic diagram of another type of positional relationship between through holes and electrodes in the crystalline silicon solar cell provided by an embodiment of the disclosure.

In another possible implementation, as shown in FIG. 4d, the through holes X are circular and provided in multiple rows, the width of the gate line is basically the same as the diameter of the through hole X, and the center line of the gate line is parallel to but not coincident with the center line of the row of through holes X, and there is a certain distance between the two.

Figure 4E:
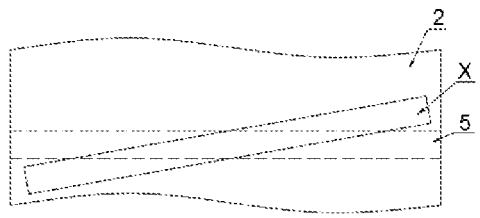
FIG. 4e is a schematic diagram of another type of positional relationship between through holes and electrodes in the crystalline silicon solar cell provided by the embodiment of the disclosure.

In another possible implementation, as shown in FIG. 4e, the through hole X is linear, the center line of the gate line and the center line of the linear through hole do not coincide, and there is a certain angle between the two.

In the embodiment of the present disclosure, the shape of the through hole X can be provided to the same shape as the electrode 5, so that the projection of the electrode 5 and the projection of the through hole X are completely overlapped on a plane parallel to the surface of the crystalline silicon substrate.

Of course, the electrode 5 may not have a portion corresponding to the through hole X at all.

In the embodiments of the present disclosure, the crystalline silicon substrate 1 may be single crystal silicon or polycrystalline silicon. The conductivity type of the crystalline silicon substrate 1 may be P-type or N-type. The resistivity of the crystalline silicon substrate 1 can be 0.5 Ω·cm~15 Ω·cm, such as 0.5 Ω·cm, 1.0 Ω·cm, 1.5 Ω·cm, 2.0 Ω·cm, 2.5 Ω·cm, 3.0 Ω·cm, 3.5 Ω·cm, 4.0 Ω·cm, 4.5 Ω·cm, 5 Ω·cm, 5.5 Ω·cm, 6 Ω·cm, 6.5 Ω·cm, 7.0 Ω·cm, 7.5 Ω·cm, 8.0 Ω·cm, 8.5 Ω·cm cm, 9.0 Ω·cm, 9.5 Ω·cm, 10.0 Ω·cm, 10.5 Ω·cm, 11.0 Ω·cm, 11.5 Ω·cm, 12.0 Ω·cm, 12.5 Ω·cm, 13.0 Ω·cm, 13.5 Ω·cm, 14.0 Ω·cm, 14.5 Ω·cm, 15.0 Ω·cm, etc., preferably 0.5 Ω·cm to 14 Ω·cm.

The cross-sectional shape of the crystalline silicon substrate 1 may be a square, or a square with four rounded corners, or other shapes may be adopted as required. The thickness of the crystalline silicon substrate 1 can be 50 microns to 500 microns, such as 50 microns, 60 microns, 70 microns, 80 microns, 90 microns, 100 microns, 110 microns, 120 microns, 130 microns, 140 microns, 150 microns, 160 microns, 170 microns, 180 microns, 190 microns, 200 microns, 210 microns, 220 microns, 230 microns, 240 microns, 250 microns, 260 microns, 270 microns, 280 microns, 290 microns, 300 microns, 310 microns, 320 microns, 330 Micron, 340 microns, 350 microns, 360 microns, 370 microns, 380 microns, 390 microns, 400 microns, 410 microns, 420 microns, 430 microns, 440 microns, 450 microns, 460 microns, 470 microns, 480 microns, 490 microns, 500 microns, etc., preferably 120 microns to 200 microns.

The passivation layer 2 may be an oxide layer, such as at least one of a silicon oxide (SiOx) layer, a titanium oxide (TiOx) layer, an aluminum oxide (AlOx) layer, a tantalum oxide (TaOx), a silicon oxynitride (SiNxOy), etc. That is, the passivation layer 2 can be a single oxide layer, or a stacked structure of multiple oxide layers. The oxide passivation layer can simultaneously play a role of chemical passivation and field passivation. The thickness of the passivation layer 2 may be 0.3 nm to 100 nm, such as 0.3 nm, 0.4 nm, 0.5 nm, 0.6 nm, 0.7 nm, 0.8 nm, 0.9 nm, 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 25 nm, 30 nm, 31 nm, 32 nm, 33 nm, 34 nm, 35 nm, 35 nm, 36 nm, 37 nm, 38 nm, 39 nm, 40 nm, 45 nm, 50 nm, 55 nm, 60 nm, 65 nm, 70 nm, 75 nm, 80 nm, 85 nm, 90 nm, 95 nm, 100 nm, etc. It can be seen that, compared with the crystalline silicon solar cell with a tunneling passivation structure in the related art, the passivation layer 2 in the crystalline silicon solar cell provided by the embodiments of the present disclosure can be thicker, thereby facilitating the preparation of the passivation layer 2.

It can be understood that the carrier collection layer 3 can be conductive, and the conductivity type of the carrier collection layer 3 may be the same as the conductivity type of the crystalline silicon substrate 1, or the opposite. The carrier collection layer mainly plays a role of field passivation. When the conductivity type of the carrier collection layer 3 is opposite to that of the crystalline silicon substrate 1, the carrier collection layer 3 can be used as the emitter of the crystalline silicon solar cell (that is, P-N junction); when the conductivity type of the carrier collection layer 3 is the same as crystalline silicon substrate 1, the carrier collection layer 3 can be used as the surface field of the crystalline silicon solar cell.

The carrier collection layer 3 may be a doped silicon layer, and specifically may be a doped polysilicon layer or a doped amorphous silicon layer. The doping element in the doped silicon layer can be a P-type doping element, such as boron (B), aluminum (Al), gallium (Ga), indium (In) and other group III elements; it can also be an N-type doping element, such as phosphorus (P), arsenic (As), bismuth (Bi), antimony (Sb) and other group V elements.

The thickness of the carrier collection layer 3 may be 30 nm to 500 nm, such as 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm, 410 nm, 420 nm, 430 nm, 440 nm, 450 nm, 460 nm, 470 nm nm, 480 nm, 490 nm, 500 nm, etc. In the embodiments of the present disclosure, the thickness of the carrier collection layer 3 refers to the thickness of the part of the carrier collection layer 3 on the passivation layer 2, that is, the size indicated by T1 in FIG. 2.

It can be understood that the resistance value of the contact surface between the electrode 5 and the carrier collection layer 3 is much smaller than the resistance value of the carrier collection layer. For example, when the electrode 5 is a metal electrode (such as a silver electrode) and the carrier collection layer 3 is a doped silicon layer, an ohmic contact should be formed between the two.

In the embodiments of the present disclosure, the end of the electrode 5 that is in contact with the carrier collection layer 3 may be located inside the carrier collection layer 3. Further, when the electrode 5 has a portion corresponding to the through hole X of the passivation layer 2, the part of the electrode 5 corresponding to the through hole X can be located inside the through hole X, but there should be a certain distance between the end of the electrode 5 located inside the through hole X and the crystalline silicon substrate 1, that is, the electrode 5 does not contact to the crystalline silicon substrate 1.

In the embodiment of the present disclosure, the electrode 5 can be directly provided on the carrier collection layer 3, or an anti-reflection layer 4 can be provided on the carrier collection layer 3, the electrode 5 passes through the anti-reflection layer 4 and contact with the carrier collection layer 3. The anti-reflection layer 4 may specifically be a single one or a stacked structure of a silicon nitride (SiNx) layer, a silicon oxide layer, a silicon oxynitride (SiOxNy) layer or an aluminum oxide layer. The thickness of the anti-reflection layer 4 may be 30 nm to 300 nm, for example, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, etc. The refractive index of the anti-reflection layer 4 may be 1.2~2.8, such as 1.2, 1.25, 1.3, 1.35, 1.4, 1.45, 1.5, 1.55, 1.6, 1.65, 1.7, 1.75, 1.8, 1.85, 1.9, 1.95, 2.0, 2.05, 2.1, 2.15, 2.2, 2.25, 2.3, 2.35, 2.4, 2.45, 2.5, 2.55, 2.6, 2.65, 2.7, 2.75, 2.8, etc. It should be noted that while the anti-reflection layer 4 has an anti-reflection effect, it can also play a certain passivation effect.

In the embodiment of the present disclosure, the passivation layer 2 and the carrier collection layer 3 described above can be provided only on one side of the crystalline silicon substrate 1, or the passivation layer 2 and the carrier collection layer 3 described above can also be provided on both sides of the crystalline silicon substrate 1. When the passivation layer 2 and the carrier collection layer 3 described above are provided only on one side of the crystalline silicon substrate 1, the doped layer 6 may be provided on the other side of the crystalline silicon substrate 1. Hereinafter, the crystalline silicon solar cells of different structures will be described separately.

The "first", "second" and similar words used in the following description do not indicate any order, quantity or importance, but are used to distinguish different components for ease of description.

The first crystalline silicon solar cell structure

Figure 5:
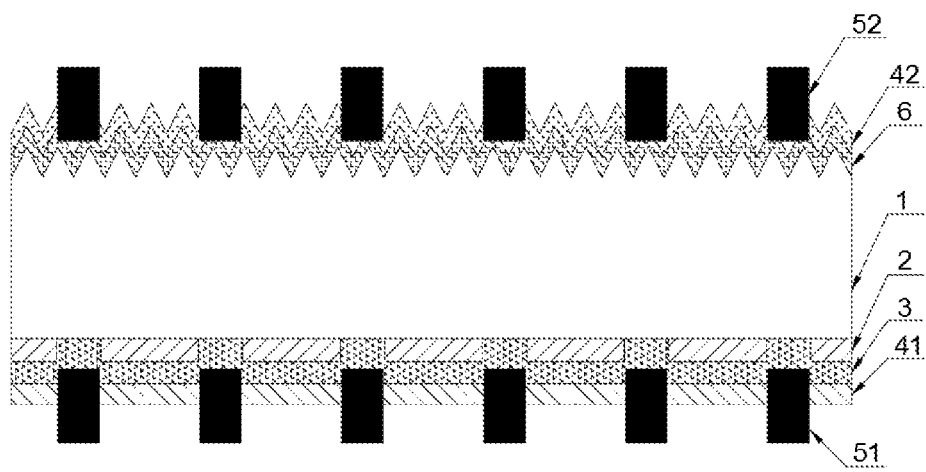
FIG. 5 is a schematic structural diagram of another crystalline silicon solar cell provided by an embodiment of the disclosure.
Figure 6:
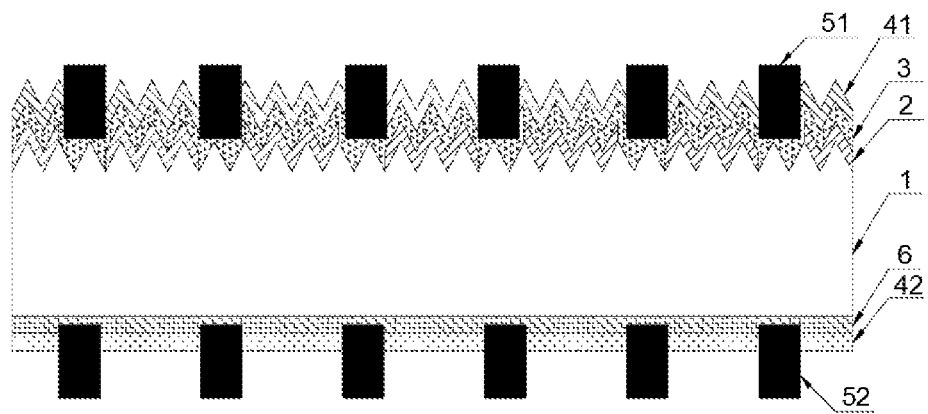
FIG. 6 is a schematic structural diagram of another crystalline silicon solar cell provided by an embodiment of the disclosure.

As shown in FIG. 5 or FIG. 6, in the crystalline silicon solar cell, the passivation layer 2 and the carrier collection layer 3 described above are provided only on one side of the crystalline silicon substrate 1, and the doped layer 6 is provided on the other side of the crystalline silicon substrate 1. For convenience of description, "first" and "second" are used to distinguish structures with the same names on both sides of the crystalline silicon substrate 1.

Specifically, the crystalline silicon solar cell includes: a crystalline silicon substrate 1, a passivation layer 2 with a through hole X provided on one side of the crystalline silicon substrate 1, a carrier collection layer 3 provided on the passivation layer 2, a first electrode 51 that is in contact with the carrier collection layer 3, a doped layer 6 provided on the other side of the crystalline silicon substrate 1, and a second electrode 52 in contact with the doped layer 6.

Wherein, the carrier collection layer 3 comes into contact with the crystalline silicon substrate 1 via the through hole X on the passivation layer 2; the conductivity type of the carrier collection layer 3 is opposite to that of the doped layer 6.

The doped layer 6 can be formed by directly doping a doping element to the surface of one side of the crystalline silicon substrate 1. The doping element in the doping layer 6 may be a P-type doping element, such as boron (B), aluminum (Al), gallium (Ga), indium (In) and other group III elements; it may also be an N-type doping element, such as phosphorus (P), arsenic (As), bismuth (Bi), antimony (Sb) and other group V elements. The conductivity type of the doped layer 6 and the conductivity type of the crystalline silicon substrate 1 may be the same or different.

In the crystalline silicon solar cell, the position and conductivity type of the carrier collection layer 3 and the doped layer 6 in the crystalline silicon solar cell can have the following four situations.

(1) As shown in FIG. 5, the doped layer 6 is located on the front surface of the crystalline silicon substrate 1 (that is, the light-receiving surface of the crystalline silicon substrate 1, the same below), and the conductivity type is opposite to that of the crystalline silicon substrate 1. The passivation layer 2 and the carrier collection layer 3 are located on the back surface of the crystalline silicon substrate 1 (that is, the back-light surface of the crystalline silicon substrate 1, the same below), and the conductivity type of the carrier collection layer 3 is the same as that of the crystalline silicon substrate 1.

Specifically, when the crystalline silicon substrate 1 is N-type silicon, the doped layer 6 is P-type, and the carrier collection layer 3 is N-type; when the crystalline silicon substrate 1 is P-type silicon, the doped layer 6 is N-type, the carrier collection layer 3 is P-type.

At this time, the doped layer 6 serves as the emitter of the crystalline silicon solar cell, and the carrier collection layer 3 serves as the back surface field of the crystalline silicon solar cell.

(2) As shown in FIG. 5, the doped layer 6 is located on the front surface side of the crystalline silicon substrate 1 and has the same conductivity type as that of the crystalline silicon substrate 1. The passivation layer 2 and the carrier collection layer 3 are located on the back surface side of the crystalline silicon substrate 1. The conductivity type of the carrier collection layer 3 is opposite to the conductivity type of the crystalline silicon substrate 1.

Specifically, when the crystalline silicon substrate 1 is N-type silicon, the doped layer 6 is N-type, and the carrier collection layer 3 is P-type; when the crystalline silicon substrate 1 is P-type silicon, the doped layer 6 is P-type, the carrier collection layer 3 is N-type.

At this time, the doped layer 6 serves as the front surface field of the crystalline silicon solar cell, and the carrier collection layer 3 serves as the emitter of the crystalline silicon solar cell.

(3) As shown in FIG. 6, the passivation layer 2 and the carrier collection layer 3 are located on the front surface side of the crystalline silicon substrate 1, and the conductivity type of the carrier collection layer 3 is opposite to the conductivity type of the crystalline silicon substrate 1. The doped layer 6 is located on the back surface side of the crystalline silicon substrate 1 and has the same conductivity type as the crystalline silicon substrate 1.

Specifically, when the crystalline silicon substrate 1 is N-type silicon, the carrier collection layer 3 is P-type, and the doped layer 6 is N-type; when the crystalline silicon substrate 1 is P-type silicon, the carrier collection layer 3 is It is N-type, and the doped layer 6 is P-type.

At this time, the carrier collection layer 3 serves as the emitter of the crystalline silicon solar cell, and the doped layer 6 serves as the back surface field of the crystalline silicon solar cell.

(4) As shown in FIG. 6, the passivation layer 2 and the carrier collection layer 3 are located on the front surface side of the crystalline silicon substrate 1, and the conductivity type of the carrier collection layer 3 is the same as that of the crystalline silicon substrate 1. The doped layer 6 is located on the back surface side of the crystalline silicon substrate 1 and has a conductivity type opposite to that of the crystalline silicon substrate 1.

Specifically, when the crystalline silicon substrate 1 is N-type silicon, the carrier collection layer 3 is N-type, and the doped layer 6 is P-type; when the crystalline silicon substrate 1 is P-type silicon, the carrier collection layer 3 is P-type, and the doped layer 6 is N-type.

At this time, the carrier collection layer 3 serves as the front surface field of the crystalline silicon solar cell, and the doped layer 6 serves as the emitter of the crystalline silicon solar cell.

The first anti-reflection layer 41 can be provided on the carrier collection layer 3 and/or the second anti-reflection layer 42 can be provided on the doped layer 6, and the first electrode 51 passes through the first anti-reflection layer 41 and contacts the carrier collection layer 3, and the second electrode 52 passes through the second anti-reflection layer 42 and contacts the doped layer 6. The composition and structure of the second anti-reflection layer 42 disposed on the doped layer 6 can refer to the above description of the first anti-reflection layer 41 disposed on the carrier collection layer 3, and will not be repeated here. The composition of the first anti-reflection layer 41 and the second anti-reflection layer 42 may be the same or different.

Both the first electrode 51 and the second electrode 52 can have a grid structure to form a crystalline silicon solar cell that can transmit light on both sides and generate electricity on both sides. The specific structures of the first electrode 51 and the second electrode 52 may be the same or different.

The second crystalline silicon solar cell structure.

Figure 7:
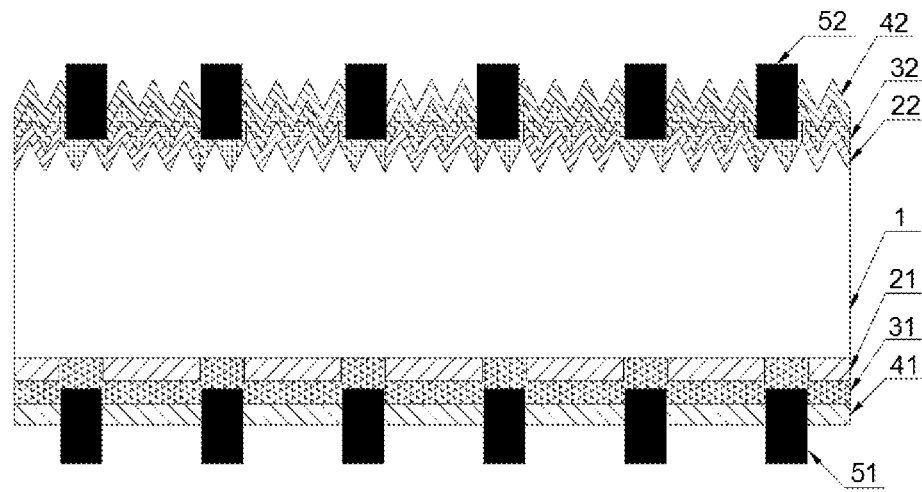
FIG. 7 is a schematic structural diagram of another crystalline silicon solar cell provided by an embodiment of the disclosure.

As shown in FIG. 7, in the crystalline silicon solar cell, the above-mentioned passivation layer 2 and carrier collection layer 3 are provided on both sides of the crystalline silicon substrate 1. For the convenience of description, "first" and "second" are used to distinguish the structures with the same name on both sides of the crystalline silicon substrate 1.

Specifically, the crystalline silicon solar cell includes: a crystalline silicon substrate 1, a first passivation layer 21 with a through hole X provided on one side of the crystalline silicon substrate 1, a first carrier collection layer 31 provided on the first passivation layer 21, a first electrode 51 in contact with the first carrier collecting layer 31, a second passivation layer 22 having the through hole X provided on the other side of the crystalline silicon substrate 1, a second carrier collection layer 32 provided on the second passivation layer 22 and a second electrode 52 in contact with the second carrier collection layer 32.

Wherein, the first carrier collection layer 31 comes into contact with the crystalline silicon substrate 1 via the through hole X on the first passivation layer 21; the second carrier collection layer 32 comes into contact with the crystalline silicon substrate 1 via the through hole X on the second passivation layer 22; the first carrier collection layer 31 has a conductivity type that is opposite to that of the second carrier collection layer 32.

In this crystalline silicon solar cell, one of the conductivity types of the first carrier collection layer 31 and the second carrier collection layer 32 is N-type, and the other is P-type. When the conductivity type of the first carrier collection layer 31 is the same as the conductivity type of the crystalline silicon substrate 1, the conductivity type of the second carrier collection layer 32 is opposite to the conductivity type of the crystalline silicon substrate 1; When the conductivity type of the first carrier collection layer 31 is opposite to the conductivity type of the crystalline silicon substrate 1, the second carrier collection layer 32 has a conductivity type that is as same as that of the crystalline silicon substrate 1.

The carrier collection layer 3 with the opposite conductivity type to the crystalline silicon substrate 1 serves as the emitter of the crystalline silicon solar cell, and the carrier collection layer 3 with the same conductivity type as the crystalline silicon substrate 1 serves as the surface field of the crystalline silicon solar cell. The carrier collection layer 3 with the opposite conductivity type to the crystalline silicon substrate 1 may be located on the front side of the crystalline silicon substrate 1. Accordingly, the carrier collection layer 3 with the same conductivity type as the crystalline silicon substrate 1 is located on the back surface side of the crystalline silicon substrate 1 and serves as the back surface field of the crystalline silicon solar cell; the carrier collection layer 3, which has the opposite conductivity type to the crystalline silicon substrate 1, can also be located on the back surface side of the crystalline silicon substrate 1, correspondingly the carrier collection layer 3 with the same conductivity type as the crystalline silicon substrate 1 is located on the front surface side of the crystalline silicon substrate 1 and serves as the front surface field of the crystalline silicon solar cell.

The specific composition of the first passivation layer 21 and the second passivation layer 22 may be the same or different. The shape, size and number of the through holes X on the first passivation layer 21 and the second passivation layer 22 may be the same or different.

The first anti-reflection layer 41 may be provided on the first carrier collection layer 31 and/or the second anti-reflection layer 42 may be provided on the second carrier collection layer 32, and the first electrode 51 passes through the first anti-reflection layer 41 and contacts the first carrier collection layer 31, and the second electrode 52 passes through the second anti-reflection layer 42 and contacts the second carrier collection layer 32. The composition of the first anti-reflection layer 41 and the second anti-reflection layer 42 may be the same or different.

The third crystalline silicon solar cell structure.

Figure 8:
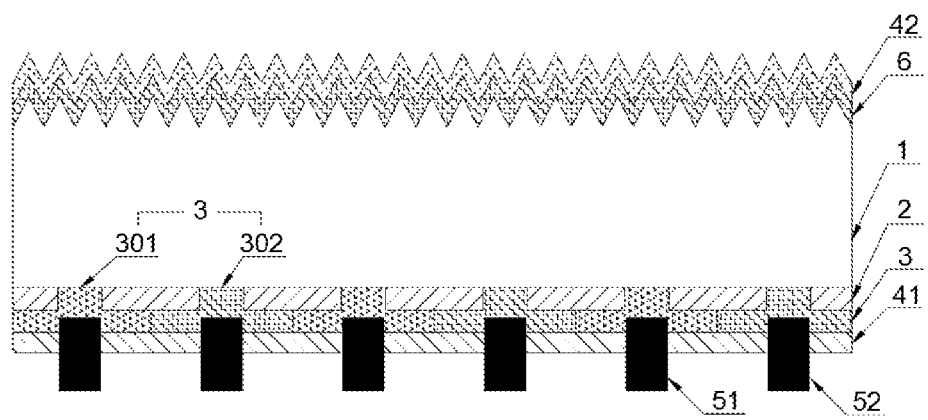
FIG. 8 is a schematic structural diagram of another crystalline silicon solar cell provided by an embodiment of the disclosure.
Figure 10A:
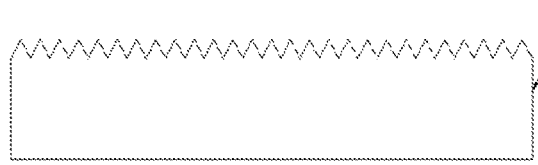
FIG. 10a to FIG. 10g are schematic diagrams of the preparation method of the crystalline silicon solar cell shown in FIG. 6.
Figure 10B:
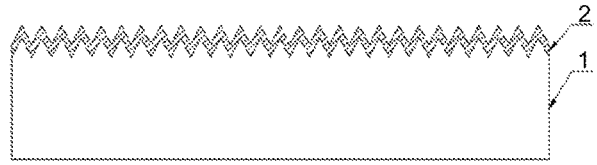
Figure 10C:
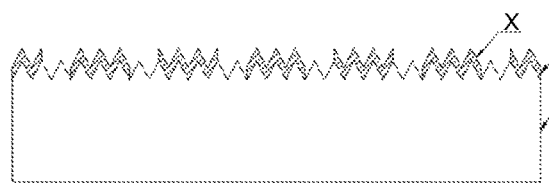
Figure 10D:
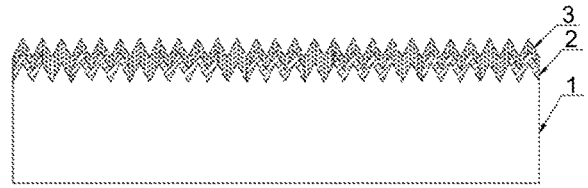
Figure 10E:
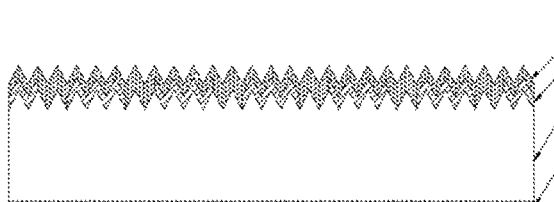
Figure 10F:
Figure 10G:
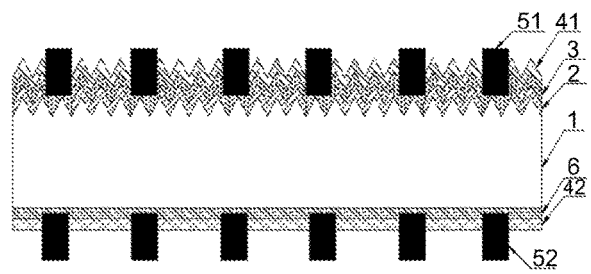

As shown in FIG. 8, in the crystalline silicon solar cell, the passivation layer 2 and the carrier collection layer 3 are provided on one side of the crystalline silicon substrate 1, and the carrier collection layer 3 has regions with opposite conductivity types, and the electrode 5 is provided on the side of the crystalline silicon substrate 1 where the carrier collection layer 3 is provided. For ease of description, "first" and "second" are used to distinguish structures with the same name on both sides of the crystalline silicon substrate 1.

Specifically, the crystalline silicon solar cell includes: a crystalline silicon substrate 1, a passivation layer 2 having a through hole X provided on one side of the crystalline silicon substrate 1, a carrier collecting layer 3 provided on the passivation layer 2 and having a first region 301 and a second region 302 of opposite conductivity types, a first electrode 51 contacting the first region 301 of the carrier collecting layer 3, a second electrode 52 contacting the second region 302 of the carrier collecting layer 3, and a doped layer 6 provided on the other side of the crystalline silicon substrate 1.

Wherein, the carrier collection layer 3 comes into contact with the crystalline silicon substrate 1 via the through hole X on the passivation layer 2; the doped layer 6 has a conductivity type that is as same as that of the crystalline silicon substrate 1.

In the crystalline silicon solar cell, one of the conductivity types of the first region 301 and the second region 302 of the carrier collection layer 3 is N-type and the other is P-type.

The doped layer 6 can be formed by directly doping a doping element to the surface of one side of the crystalline silicon substrate 1. The doping element in the doping layer 6 may be a P-type doping element, such as boron (B), aluminum (Al), gallium (Ga), indium (In) and other group III elements; it may also be an N-type doping element, such as phosphorus (P), arsenic (As), bismuth (Bi), antimony (Sb) and other group V elements.

It can be understood that one of the first region 301 and the second region 302 of the carrier collection layer 3 has the same conductivity type as the crystalline silicon substrate 1, and the other has the opposite conductivity type to the crystalline silicon substrate 1. Among them, the region of the carrier collection layer 3 that has the opposite conductivity type to that of the crystalline silicon substrate 1 serves as the emitter of the crystalline silicon solar cell.

The carrier collection layer 3 may be provided on the front surface side of the crystalline silicon substrate 1 or on the back surface side of the crystalline silicon substrate 1. In an optional embodiment, the carrier collection layer 3 is provided on the back surface side of the crystalline silicon substrate 1, and the doped layer 6 is provided on the front surface side of the crystalline silicon substrate 1. At this time, the first electrode 51 and the second electrode 52 are both located on the back surface side of the crystalline silicon substrate 1, and the front surface side of the crystalline silicon substrate 1 is not blocked by the electrode 5, which can increase the amount of light incident and is beneficial to improve the photoelectric conversion efficiency of crystalline silicon solar cells.

In the crystalline silicon solar cell, the carrier collection layer 3 may have a plurality of first regions 301 and a plurality of second regions 302, and the plurality of first regions 301 and a plurality of second regions 302 are distributed alternately. Optionally, the first region 301 and the second region 302 are both rectangular regions, and the plurality of first regions 301 and the plurality of second regions 302 are alternately provided along the side length direction of the crystalline silicon substrate 1. The adjacent first region 301 and the second region 302 may be separated by a certain distance or an insulating structure may be provided to insulate the first region 301 and the second region 302.

The shape, size, and number of the through holes X on the passivation layer 2 corresponding to the first region 301 and the second region 302 of the carrier collection layer 3 may be the same or different.

In the crystalline silicon solar cell, the first electrode 51 and the second electrode 52 can be finger electrodes.

The first anti-reflective layer 41 can be provided on the carrier collection layer 3 and/or the second anti-reflective layer 42 is provided on the doped layer 6, and the first electrode 51 passes through the first anti-reflective layer 41 and contacts the first carrier collection layer 31, and the second electrode 52 passes through the second anti-reflection layer 42 and contacts the doped layer 6. The composition of the first anti-reflection layer 41 and the second anti-reflection layer 42 may be the same or different.

For the third crystalline silicon solar structure, the following modifications can be made:

(1) the doped layer 6 is provided in the form of a first region 301 and a second region 302 with opposite conductivity types, and the first electrode 51 and the second electrode 52 are respectively connected to the first region 301 and the second region 302 of the doped layer 6. Among them, the region of the first region 301 and the second region 302 of the doped layer 6 that has the opposite conductivity type to the crystalline silicon substrate 1 serves as the emitter of the crystalline silicon solar cell, and the carrier collection layer 3 has a single, identical and same conductivity type to the crystalline silicon substrate 1 as the surface field of crystalline silicon solar cell. Optionally, the doped layer 6 is located on the back surface of the crystalline silicon substrate 1, and the carrier transport layer is located on the front surface side of the crystalline silicon substrate 1, so that the electrode 5 is located on the back surface side of the crystalline silicon substrate 1, and the front surface side is not blocked by the electrode 5.

(2) replace the doped layer 6 with a passivation layer 2 and a carrier collection layer 3 with a single and identical conductivity type to that of the crystalline silicon substrate 1, that is, both sides of the crystalline silicon substrate 1 have passivation layers 2 and the carrier collection layer 3, the carrier collection layer 3 on one side has a first region 301 and a second region 302 with opposite conductivity types, and the first electrode 51 and the second electrode 52 are in contact with the first region 301 and the second region respectively, and the region opposite to the conductivity type of the crystalline silicon substrate 1 serves as the emitter of the crystalline silicon solar cell; the carrier collection layer 3 on the other side has a single conductivity type and is the same as the conductivity type of the crystalline silicon substrate 1, as the surface field of the crystalline silicon solar cell. Optionally, the carrier collection layer 3 having the first region 301 and the second region 302 with opposite conductivity types is located on the back surface side of the crystalline silicon substrate 1, so that the electrode 5 is located on the back surface side of the crystalline silicon substrate 1, the front surface side is not blocked by the electrode 5.

In the embodiments of the present disclosure, the front surface of the crystalline silicon substrate 1 may have a textured structure to reduce the reflection of incident light; the back surface of the crystalline silicon substrate 1 may be a relatively flat and smooth surface obtained by polishing or wet etching, or may be a surface with textured structure.

Unless otherwise specified, when a component such as "layer", "region", etc., involved in the embodiments of the present disclosure is located or disposed on another component, the component may be directly located or disposed on the other component, there is no other component in between, and it can also be indirectly located or set on another component, and there are one or more intermediate components between the two.

In an optional implementation of the embodiment of the present disclosure, the passivation layer 2 is directly disposed on one side surface of the crystalline silicon substrate 1, and the carrier collection layer 3 is directly disposed on the passivation layer 2. In the embodiments of the present disclosure, other structures can be provided between the crystalline silicon substrate 1 and the passivation layer 2, and/or between the carrier collection layer 3 and the passivation layer 2, according to actual needs. It is understandable that other structures provided between the crystalline silicon substrate 1 and the passivation layer 2 and/or between the carrier collection layer 3 and the passivation layer 2 also need to be provided the through hole X corresponding to the through hole X on the passivation layer 2, so that the carrier collection layer 3 can contact the crystalline silicon substrate 1.

Hereinafter, the preparation method of the crystalline silicon solar cell provided by the embodiments of the present disclosure will be described.

The preparation method of the crystalline silicon solar cell provided by the embodiments of the present disclosure mainly includes providing a crystalline silicon substrate 1, forming a passivation layer 2 with a through hole X on the crystalline silicon substrate 1, forming a carrier collection layer 3 on the passivation layer 2 and on the portion of the crystalline silicon substrate 1 corresponding to the through hole X of the passivation layer 2, and forming the electrode 5 in contact with the carrier collecting layer 3 and so on. According to the foregoing, the crystalline silicon solar cell produced by the preparation method provided by the embodiments of the present disclosure has good passivation effect, good carrier transport performance, and high photoelectric conversion efficiency.

In addition to the above-mentioned steps, the preparation method provided in the embodiments of the present disclosure also includes the steps of cleaning the crystalline silicon substrate and texturing the surface of the crystalline silicon substrate necessary in the solar cell preparation process. Moreover, for crystalline silicon solar cells of different structures, the sequence of the above steps and the specific implementation manners are also different. The preparation methods of crystalline silicon solar cells with different structures are separately described below.

The preparation method of the first crystalline silicon solar cell shown in FIG. 5 and FIG. 6

As shown in FIGS. 9a to 9g, or FIGS. 10a to 10g, the manufacturing method of the solar cell includes the following steps.

In step A01, cleaning the crystalline silicon substrate 1, and texturing the front surface of the crystalline silicon substrate 1 to form a textured structure on the front surface of the crystalline silicon substrate 1.

In this step, the crystalline silicon substrate 1 can be cleaned with a mixed aqueous solution of sodium hydroxide (NaOH) and hydrogen peroxide ($H_2O_2$) to remove contaminants and damaged layers on the surface of the crystalline silicon substrate 1.

Alkaline solution can be used for texturing, for example, an aqueous sodium hydroxide solution with a mass concentration of 0.5% to 5% (such as 0.5%, 1%, 1.5%, 2%, 2.5%, 3%, 3.5%, 4%, 4.5%, 5%, etc.) can be used to make texturing at a temperature of 75° C. to 90° C. (such as 75° C., 76° C., 78° C., 80° C., 82° C., 84° C., 85° C., 86° C., 88° C., 90° C., etc.).

Acidic solution can also be used to make texturing.

After texturing, the reflectivity of the surface of the single crystal silicon substrate 1 can be 10%-18% (for example, 10%, 11%, 12%, 13%, 14%, 15%, 16%, 17%, 18%, etc.), the reflectivity of the surface of the polycrystalline silicon substrate 1 can be 6%-20% (for example, 6%, 7%, 8%, 9%, 10%, 11%, 12%, 13%, 14%, 15%, 16%, 17%, 18%, 19%, 20%, etc.).

If the back surface of the crystalline silicon substrate 1 also needs to be textured, the texturing of the front surface and the back surface of the crystalline silicon substrate 1 can be carried out simultaneously in this step.

Step A02, forming a passivation layer 2 on one side of the crystalline silicon substrate 1.

It is understandable that when the passivation layer 2 is provided on the front surface side of the crystalline silicon substrate 1, the step is specifically to form the passivation layer 2 on the front surface side of the crystalline silicon substrate 1; When the silicon substrate 1 is on the back surface side, this step is specifically to form the passivation layer 2 on the back surface of the crystalline silicon substrate 1.

The process for forming the passivation layer 2 can be selected according to the specific composition of the passivation layer 2, comprising but not being limited to an atomic layer deposition (ALD) process, or a chemical vapor deposition (CVD) process.

For the case where a silicon oxide layer is directly formed on the surface of the crystalline silicon substrate 1 as the passivation layer 2, high temperature thermal oxidation process, nitric acid oxidation process, dry ozone oxidation process, wet ozone oxidation process, etc. can also be used on the surface of the crystalline silicon substrate 1 to form the silicon oxide layer. Taking the nitric acid oxidation process to prepare a silicon oxide layer with a thickness of 0.3 nm to 100 nm as an example, the mass concentration of nitric acid can be 1% to 20%, such as 1%, 2%, 4%, 5%, 6%, 8%, 10%, 12%, 14%, 15%, 16%, 18%, 20%, etc. The treatment time with nitric acid can be 2 minutes to 20 minutes, such as 2 minutes, 4 minutes, 5 minutes, 6 minutes, 8 minutes, 10 minutes, 12 minutes, 14 minutes, 15 minutes, 16 minutes, 18 minutes, 20 minutes, etc.

Step A03, opening a through hole X in the passivation layer 2.

In this step, according to the set pattern of the through hole X, the part corresponding to the passivation layer 2 is removed, and the through hole X is formed on the passivation layer 2.

A laser etching process or a chemical etching mask process can be used to open a through hole X on the passivation layer 2.

It is understandable that in the laser etching process, the laser pattern is the same as the through hole X pattern on the passivation layer 2; in the chemical etching mask process, the pattern of the hollow region of the mask is the same as the through hole X pattern on the passivation layer 2.

If other structures are provided between the crystalline silicon substrate 1 and the passivation layer 2, and between the passivation layer 2 and the carrier collection layer 3, in this step, the opening of other structures can be carried out at the same time, so that the part of the crystalline silicon substrate 1 corresponding to the through hole X is exposed.

In step A04, a carrier collection layer 3 is formed on the passivation layer 2 and on the part (that is, the exposed part of the crystalline silicon substrate 1) of the crystalline silicon substrate 1 corresponding to the through hole X of the passivation layer 2.

The process of forming the carrier collection layer 3 can be selected according to the specific composition of the carrier collection layer 3.

For the case where a doped silicon layer is used as the carrier collection layer 3, the following optional methods can be used to form the doped silicon layer.

The first method, the doped silicon layer is obtained by introducing the doping source during the process of growing the intrinsic silicon layer, that is, forming the doped silicon layer in an environment where the doping source exists. In this method, phosphorane can be used as the doping source of phosphorus element, and borane can be used as the doping source of boron element. In this process, the heating peak temperature can be 800° C. to 1000° C., such as 800° C., 820° C., 840° C., 850° C., 860° C., 870° C., 880° C., 900° C., 920° C., 940° C., 950° C., 960° C., 980° C., 1000° C., etc., the heat treatment time can be 30 minutes to 200 minutes, such as 30 minutes, 40 minutes, 50 minutes, 60 minutes, 70 minutes, 80 minutes, 90 minutes, 100 minutes, 110 minutes, 120 minutes, 130 minutes, 140 minutes, 150 minutes, 160 minutes, 170 minutes, 180 minutes, 190 minutes, 200 minutes, etc.

The second method, the intrinsic silicon layer is grown first, and then the intrinsic silicon layer is doped with doping elements to form the doped silicon layer.

In this method, doping the doping elements into the intrinsic silicon layer may specifically include: using ion implantation equipment to implant doping ions (such as phosphorus ions or boron ions) into the intrinsic silicon layer, and then annealing to obtain the doped silicon layer; Or form a silica glass layer containing a doping source on the intrinsic silicon layer (such as phosphosilicate glass PSG or borosilicate glass BSG), and then perform annealing to make the doping source in the silica glass layer enter the intrinsic silicon layer to obtain the doped silicon layer; or directly doping the intrinsic silicon layer by methods of thermal diffusion.

The above-mentioned silica glass containing doping sources can be prepared by using APCVD equipment. The annealing temperature in the above annealing process can be 600° C. to 950° C., such as 600° C., 620° C., 640° C., 650° C., 660° C., 680° C., 700° C., 720° C., 740° C., 750° C., 760° C., 780° C., 800° C., 820° C., 840° C., 850° C., 860° C., 880° C., 900° C., 920° C., 940° C., 950° C., etc.

In the first and second methods above, the intrinsic silicon layer can be prepared by using LPCVD equipment.

Step A05, forming a doped layer 6 on the opposite side of the crystalline silicon substrate 1 to the passivation layer 2.

It is understandable that when the passivation layer 2 is formed on the front surface side of the crystalline silicon substrate 1 in step A02, the doped layer 6 is formed on the back surface side of the crystalline silicon substrate 1 in this step; When the passivation layer 2 is formed on the back surface side of the crystalline silicon substrate 1 in step A02, the doped layer 6 is formed on the front surface side of the crystalline silicon substrate 1 in this step.

In this step, the method for forming the doped layer 6 can be specifically as follows: implanting doped ions (such as phosphorous ions or boron ions) into the surface of the crystalline silicon substrate 1 opposite to the passivation layer 2 using ion implantation equipment, and then annealing to obtain the doped layer 6; or form a silica glass layer containing a doping source (such as phosphosilicate glass PSG or borosilicate glass BSG) on the surface of the crystalline silicon substrate 1 opposite to the passivation layer 2, and then perform annealing to make the doping source in the silica glass layer enter the intrinsic silicon layer to obtain the doped layer 6; or the surface of the crystalline silicon substrate 1 opposite to the passivation layer 2 is doped directly by thermal diffusion to form the doped layer 6.

It should be noted that step A05 can be performed after step A04 (as shown in FIG. 10a to FIG. 10g), or can be performed after step A01 and before step A02 (as shown in FIG. 9a to FIG. 9g). Generally speaking, when the doped layer 6 is on the side of the front surface of the crystalline silicon substrate 1, step A05 is performed between steps A01 and A02; when the doped layer 6 is on the side of the back surface of the crystalline silicon substrate 1, step A05 is performed after step A04.

Step A06, forming a first anti-reflection layer 41 on the carrier collection layer 3 and/or forming a second anti-reflection layer 42 on the doped layer 6.

The specific formation method of the first anti-reflection layer 41 and the second anti-reflection layer 42 can be determined according to the specific composition of the two. For example, for a silicon nitride layer as the anti-reflection layer 4, the silicon nitride layer can be formed by a PECVD process.

The first anti-reflection layer 41 and the second anti-reflection layer 42 can be respectively formed in a certain sequence. When the first anti-reflection layer 4 and the second anti-reflection layer 42 have the same composition, they can be formed at the same time.

In step A07, forming the first electrode 51 that is in contact with the carrier collection layer 3, and forming the second electrode 52 in contact with the doped layer 6.

In this step, when the anti-reflection layer 4 is provided on the carrier collection layer 3 and the doped layer 6, the slurry for forming the first electrode 51 and the second electrode 52 is printed on the corresponding anti-reflection layer 4. Then, sintering is performed to form the first electrode 51 and the second electrode 52.

If the anti-reflection layer 4 is not provided on the carrier collection layer 3 and/or the doped layer 6, the paste for forming the first electrode 51 and the second electrode 52 will be directly printed on the carrier collection layer 3 and/or the doped layer 6.

The sintering conditions can be determined according to the composition of the specific slurry. For example, the slurry can be sintered at a temperature of 600° C. to 900° C. (for example, 600° C., 620° C., 640° C., 650° C., 660° C., 680° C., 700° C., 720° C., 740° C., 750° C., 760° C., 780° C., 800° C., 820° C., 840° C., 850° C., 860° C., 880° C., 900° C., etc.).

The preparation method of the second crystalline silicon solar cell shown in FIG. 7.

As shown in FIG. 11a to FIG. 11f, the preparation method of the solar cell includes the following steps.

In step B01, cleaning the crystalline silicon substrate 1 is cleaned, and texturing the front surface of the crystalline silicon substrate 1 to form a textured structure on the front surface of the crystalline silicon substrate 1.

For the specific process of cleaning and texturing the crystalline silicon substrate 1, please refer to the description in step A01 above, which will not be repeated here.

Step B02, forming a first passivation layer 21 with a through hole X on one side of the crystalline silicon substrate 1, and a second passivation layer 22 with a through hole X on the other side of the crystalline silicon substrate 1.

For the specific process of forming the first passivation layer 21 and the second passivation layer 22, please refer to the description in step A02, which will not be repeated here.

It should be noted that the first passivation layer 21 and the second passivation layer 22 can be respectively formed in a sequential order. When the first passivation layer 21 and the second passivation layer 22 have the same composition, they can be formed at the same time.

Step B03, opening through holes X in the first passivation layer 21 and the second passivation layer 22 respectively.

The specific manner of opening the through holes X on the first passivation layer 21 and the second passivation layer 22 can refer to the description of the above step A03, which will not be repeated here.

Step B04, forming a first carrier collection layer 31 on the first passivation layer 21 and on the part of the crystalline silicon substrate 1 corresponding to the through hole X of the first passivation layer 21, forming a second carrier collection layer 32 with opposite conductivity type to that of the first carrier on the second passivation layer 22 and on the part of the crystalline silicon substrate 1 corresponding to the through hole X of the second passivation layer 22.

The specific formation of the first carrier collection layer 31 and the second carrier collection layer 32 can refer to the description in the above step A04, which will not be repeated here.

It should be noted that when the intrinsic silicon layer is formed first, and then the intrinsic silicon layer is doped to form the doped silicon layer, the first intrinsic silicon layer may be formed on the first passivation layer 21 and the second intrinsic silicon layer may be formed on the second passivation layer 22 at the same time, then, the first intrinsic silicon layer and the second intrinsic silicon layer are doped. Optionally, during the doping process, ion implantation is performed on the first intrinsic silicon layer and the second intrinsic silicon layer respectively, or after forming the silicon glass containing the doping source on the first intrinsic silicon layer and the second intrinsic silicon layer respectively, an annealing is performed to complete the doping of the first intrinsic silicon layer and the second intrinsic silicon layer.

In step B05, forming a first anti-reflection layer 41 on the first carrier collection layer 31 and/or forming a second anti-reflection layer 42 on the second carrier collection layer 32.

In this step, the specific formation of the first anti-reflection layer 41 and the second anti-reflection layer 42 can refer to the description in step A06, which will not be repeated here.

Step B06, forming the first electrode 51 in contact with the first carrier collecting layer 31, and forming the second electrode 52 in contact with the second carrier collecting layer 32.

In this step, when the anti-reflection layer 4 is provided on the first carrier collection layer 31 and the second carrier collection layer 32, the slurry for forming the first electrode 51 and the second electrode 52 is printed on the corresponding anti-reflection layer 4, and then sintering to form the first electrode 51 and the second electrode 52.

If the anti-reflection layer 4 is not provided on the first carrier collection layer 31 and/or the second carrier collection layer 32, the slurry for forming the first electrode 51 and the second electrode 52 will be printed directly on the first carrier collection layer 31 and/or the second carrier collection layer 32.

The sintering conditions of the slurry used to form the first electrode 51 and the second electrode 52 can refer to the description in step A07 above, and will not be repeated here.

The preparation method of the third crystalline silicon solar cell shown in FIG. 8.

As shown in FIGS. 12a to 12g, the method for preparing the solar cell includes the following steps.

In step C01, cleaning the crystalline silicon substrate 1, and texturing the front surface of the crystalline silicon substrate 1 to form a textured structure on the front surface of the crystalline silicon substrate 1.

For the specific process of cleaning and texturing the crystalline silicon substrate 1, it may refer to the description in step A01 above, which will not be repeated here.

Step C02, forming a passivation layer 2 on one side of the crystalline silicon substrate 1.

The specific process of forming the passivation layer 2 can refer to the description in the above step A02, which will not be repeated here.

Step C03, opening a through hole X on the passivation layer 2.

The specific process of opening the through hole X on the passivation layer 2 can refer to the description in the above step A03, which will not be repeated here.

Step C04, forming a carrier collection layer 3 having a first region 301 and a second region 302 with opposite conductivity types on the passivation layer 2 and on the portion of the crystalline silicon substrate 1 corresponding to the through hole X of the passivation layer 2.

For the case where a doped silicon layer is used as the carrier collection layer 3, the intrinsic silicon layer can be grown first, and then the first and second doping sources with opposite conductivity types are used to dope different regions of the intrinsic silicon layer to form a doped silicon layer having a first region 301 and a second region 302 with opposite conductivity types.

Ion implantation equipment can be used to implant different doping ions into different regions of the intrinsic silicon layer, such as implanting phosphorus ions and boron ions, and then annealing to obtain a doped silicon layer with phosphorus doped regions and boron doped regions.

In this step, the specific formation method of the intrinsic silicon layer, the specific process of ion implantation and annealing can refer to the description of the above step A04, which will not be repeated here.

Step C05, forming a doped layer 6 with the same conductivity type as the crystalline silicon substrate 1 on the side of the crystalline silicon substrate 1 opposite to the carrier collection layer 3.

The specific forming method of the doped layer 6 can refer to the description of the above step A05, which will not be repeated here.

It should be noted that step C05 can be performed after step C04, or can be performed after step C01 and before step C02.

Step C06, forming a first anti-reflection layer 41 on the carrier collection layer 3 and/or forming a second anti-reflection layer 42 on the doped layer 6.

The specific formation of the first anti-reflection layer 41 and the second anti-reflection layer 42 can refer to the description in step A06, which will not be repeated here.

Step C07, forming a first electrode 51 in contact with the first region 301 of the carrier collecting layer 3, and forming a second electrode 52 in contact with the second region 302 of the carrier collecting layer 3.

In this step, when the first anti-reflection layer 41 is provided on the carrier collection layer 3, a slurry for forming the first electrode 51 is printed on the first anti-reflection layer 41 at a position corresponding to the first region 301 of the carrier collection layer 3, a slurry for forming the second electrode 52 is printed on the first anti-reflection layer 41 at a position corresponding to the second region 302 of the carrier collection layer 3, and then sintering to form the first electrode 51 and the second electrode 52.

If the first anti-reflection layer 41 is not provided on the carrier collection layer 3, a slurry for forming the first electrode 51 and the second electrode 52 is directly printed on the first region 301 and the second region 302 of the carrier collection layer 3.

The sintering conditions of the slurry used to form the first electrode 51 and the second electrode 52 can refer to the description in step A07 above, and will not be repeated here.

Based on the above-mentioned crystalline silicon solar cell, embodiments of the present disclosure also provide photovoltaic modules using the above-mentioned crystalline silicon solar cell. The photovoltaic module includes a cover plate, a first encapsulating adhesive film, a solar cell string, a second encapsulating adhesive film, and a back plate arranged in sequence, wherein the solar cell string includes a plurality of crystalline silicon solar cells provided by embodiments of the present disclosure.

It is understandable that, in the crystalline silicon solar cell provided by the embodiment of the present disclosure, the passivation layer is provided with through holes, and the carrier collection layer contacts the crystalline silicon substrate via the through hole on the passivation layer, therefore, on the basis of ensuring the surface passivation effect, the carriers can pass through the interface between the crystalline silicon substrate and the carrier collection layer to be collected by the electrode, realize the effective transmission of the carriers, and improve the photoelectric conversion efficiency of the crystalline silicon solar cell, further improve the photovoltaic module using the crystalline silicon solar cell of a higher output power, reduce the cost of per kilowatt-hour, and improve the cost performance of photovoltaic power generation.

In the embodiments of the present disclosure, the cover plate is a glass plate, the materials of the first encapsulating adhesive film and the second encapsulating adhesive film may be EVA (ethylene-vinyl acetate copolymer) or POE (ethylene-octene copolymer), and the back plate may be a glass plate or a TPT (PVF/PET/PVF) plate. The photovoltaic module also includes a frame, which can be filled with sealant (such as silica gel).

In the photovoltaic module provided by the embodiments of the present disclosure, the crystalline silicon solar cell may be a square or a square with four rounded corners as a whole cell, or a sliced cell obtained by cutting the whole cell.

The photovoltaic module provided by the embodiments of the present disclosure may include multiple solar cell strings, and the cells in each solar cell string may be connected by soldering tape, or by conductive glue or other conductive materials. In each string of solar cell strings, a certain gap can be left between adjacent battery pieces, or the edges of adjacent battery cells can be overlapped, that is, connected by shingling.

In summary, in the embodiments of the present disclosure, through holes are opened on the passivation layer, and the carrier collection layer comes into contact with the crystalline silicon substrate via the through holes on the passivation layer, thereby ensuring the surface passivation effect, then carriers can pass through the interface between the crystalline silicon substrate and the carrier collection layer to be collected by the electrode, realize effective carrier transmission, reduce the series resistance of crystalline silicon solar cells, and increase the fill factor of crystalline silicon solar cells. Furthermore, the photoelectric conversion efficiency of crystalline silicon solar cells is improved, the cost of per kilowatt-hour is reduced, and the cost-effectiveness of photovoltaic power generation is improved.

The foregoing description is only for the convenience of those skilled in the art to understand the technical solutions of the present disclosure, and is not intended to limit the present disclosure. Any modification, equivalent replacement, improvement, etc., made within the spirit and principle of the present disclosure shall be included in the protection scope of the present disclosure.

The invention claimed is:

1. A crystalline silicon solar cell, including:
a crystalline silicon substrate,
a passivation layer that is provided on a side of said crystalline silicon substrate and has a through hole,
a carrier collection layer that is provided on said passivation layer; and,
an electrode that is in contact with said carrier collection layer;
wherein, said carrier collection layer comes into contact with the crystalline silicon substrate via the through hole on said passivation layer,
wherein said electrode has a portion corresponding to the through hole on said passivation layer and the portion of said electrode corresponding to the through hole is located inside the through hole, and wherein there is a certain distance between the end of the portion of said electrode located inside the through hole and the crystalline silicon substrate; and
the certain distance is less than the depth of the through hole,
wherein said crystalline silicon solar cell further comprises: an anti-reflection layer provided on said carrier collection layer; said electrode passes through said anti-reflection layer and comes into contact with said carrier collection layer.

2. The crystalline silicon solar cell according to claim 1, wherein the through hole has a cross-section of linear, circular or polygonal shape in a direction parallel to a surface of said crystalline silicon substrate.

3. The crystalline silicon solar cell according to claim 1, wherein said passivation layer is provided with a plurality of through holes.

4. The crystalline silicon solar cell according to claim 1, further including:
- a second passivation layer that is provided on the other side of said crystalline silicon substrate and has a through hole;
- a second carrier collection layer that is provided on said second passivation layer and,
- a second electrode that is in contact with said second carrier collection layer;
- wherein said second carrier collection layer comes into contact with said crystalline silicon substrate via the through hole on said second passivation layer;
- said first carrier collection layer has a conductivity type that is opposite to that of said second carrier collection layer.

5. A crystalline silicon solar cell, including:
- a crystalline silicon substrate,
- a passivation layer that is provided on one side of said crystalline silicon substrate and has a through hole,
- a carrier collection layer that is provided on said passivation layer and has a first region and a second region having opposite conductivity types,
- a first electrode that is in contact with the first region of said carrier collection layer,
- a second electrode that is in contact with the second region of said carrier collection layer, and,
- a doped layer that is provided on the other side of said crystalline silicon substrate;
- wherein, said carrier collection layer comes into contact with said crystalline silicon substrate via the through hole on said passivation layer;
- said doped layer has a conductivity type same as the conductivity type of said crystalline silicon substrate,
- wherein said first electrode has a portion corresponding to the through hole on said passivation layer and the portion of the first electrode corresponding to the through hole is located inside the through hole, and wherein there is a certain distance between the end of the portion of the first electrode located inside the through hole and the crystalline silicon substrate; and
- the certain distance is less than the depth of the through hole.

6. A photovoltaic module, including: a cover plate, a first encapsulating adhesive film, a solar cell string, a second encapsulating adhesive film, and a back plate arranged in sequence, wherein said solar cell string comprises a plurality of solar cells, each of said solar cells is the crystalline silicon solar cell according to claim 1.

7. A crystalline silicon solar cell, including:
- a crystalline silicon substrate,
- a passivation layer that is provided on a side of said crystalline silicon substrate and has a through hole,
- a carrier collection layer that is provided on said passivation layer;
- an electrode that is in contact with said carrier collection layer;
- a doped layer that is provided on the other side of said crystalline silicon substrate; and,
- a second electrode that is in contact with said doped layer,
- wherein, said carrier collection layer has a conductivity type that is opposite to that of said doped layer,
- wherein, said carrier collection layer comes into contact with the crystalline silicon substrate via the through hole on said passivation layer,
- wherein said electrode has a portion corresponding to the through hole on said passivation layer and the portion of said electrode corresponding to the through hole is located inside the through hole, and wherein there is a certain distance between the end of the portion of said electrode located inside the through hole and the crystalline silicon substrate; and
- the certain distance is less than the depth of the through hole.

8. The crystalline silicon solar cell according to claim 7, wherein the through hole has a cross-section of linear, circular or polygonal shape in a direction parallel to a surface of said crystalline silicon substrate.

9. The crystalline silicon solar cell according to claim 7, wherein said passivation layer is provided with a plurality of through holes.

10. The crystalline silicon solar cell according to claim 7, wherein said electrode has a portion corresponding to the through hole on said passivation layer.

11. The crystalline silicon solar cell according to claim 7, wherein said crystalline silicon solar cell further comprises: an anti-reflection layer provided on said carrier collection layer; said electrode passes through said anti-reflection layer and comes into contact with said carrier collection layer.

12. The crystalline silicon solar cell according to claim 7, further including:
- a second passivation layer that is provided on the other side of said crystalline silicon substrate and has a through hole;
- a second carrier collection layer that is provided on said second passivation layer and,
- a second electrode that is in contact with said second carrier collection layer;
- wherein said second carrier collection layer comes into contact with said crystalline silicon substrate via the through hole on said second passivation layer;
- said first carrier collection layer has a conductivity type that is opposite to that of said second carrier collection layer.

* * * * *